United States Patent
Saito et al.

[11] Patent Number: 6,043,749
[45] Date of Patent: Mar. 28, 2000

[54] FREQUENCY DETECTION CIRCUIT

[75] Inventors: Hirofumi Saito; Norio Funahashi, both of Kanagawa, Japan

[73] Assignee: NEC Corporation, Tokyo, Japan

[21] Appl. No.: 09/060,818

[22] Filed: Apr. 16, 1998

[30] Foreign Application Priority Data

Apr. 16, 1997 [JP] Japan .................................... 9-099096

[51] Int. Cl.[7] .................................................. G08B 21/00
[52] U.S. Cl. ................... 340/658; 340/657; 340/870.26; 714/814
[58] Field of Search ..................... 340/657, 658, 340/656, 660, 661, 870.26, 521; 714/814; 324/76.66, 76.39; 331/26, 27, 49

[56] References Cited

U.S. PATENT DOCUMENTS

| | | | |
|---|---|---|---|
| 4,667,328 | 5/1987 | Imran | 714/814 |
| 5,416,443 | 5/1995 | Cranford, Jr. et al. | 331/2 |
| 5,583,819 | 12/1996 | Roesner et al. | 365/225.7 |
| 5,657,361 | 8/1997 | Inagaki et al. | 377/39 |

FOREIGN PATENT DOCUMENTS

| | | |
|---|---|---|
| 2 449 286 | 9/1980 | France . |
| 23 50 514 | 4/1975 | Germany . |
| 55-16540 | 2/1980 | Japan . |
| 4-23510 | 1/1992 | Japan . |
| 6-244717 | 9/1994 | Japan . |
| 7-95253 | 4/1995 | Japan . |

OTHER PUBLICATIONS

Japanese Office Action with translation of information encircled in red ink.

Patent Abstracts of Japan, vol. 16, No. 412 (E–1256), Aug. 31, 1992.

*Primary Examiner*—Jeffery A. Hofsass
*Assistant Examiner*—Van T. Trieu
*Attorney, Agent, or Firm*—Sughrue, Mion, Zinn Macpeak & Seas, PLLC

[57] ABSTRACT

A frequency detection circuit has a transistor switching device between first and second electric potentials, and a gate applied with a clock signal. A resistor and a capacitor are connected in parallel between the output of the transistor switching device and the second potential. The capacitor is charged toward the first potential when the clock signal assumes one level and discharged toward the second potential in accordance with a time constant determined by the resistor and the capacitor when the clock signal changes to the other level. A comparison device connected to the output of the transistor switching device compares an output voltage of the transistor switching device with a predetermined threshold voltage and delivers an AC signal when the clock signal is small causing the output voltage of the transistor switching device to cross the threshold voltage during discharge of the capacitor, but a DC signal when the frequency of the clock signal is large causing the output voltage of the transistor switching device not to cross the threshold voltage.

4 Claims, 6 Drawing Sheets

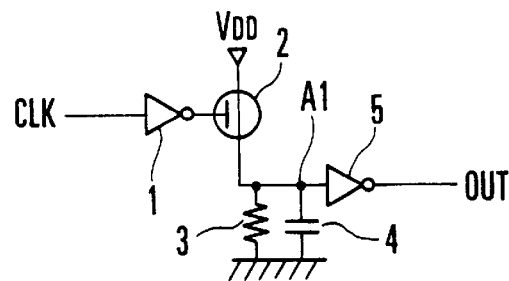
FIG. 1
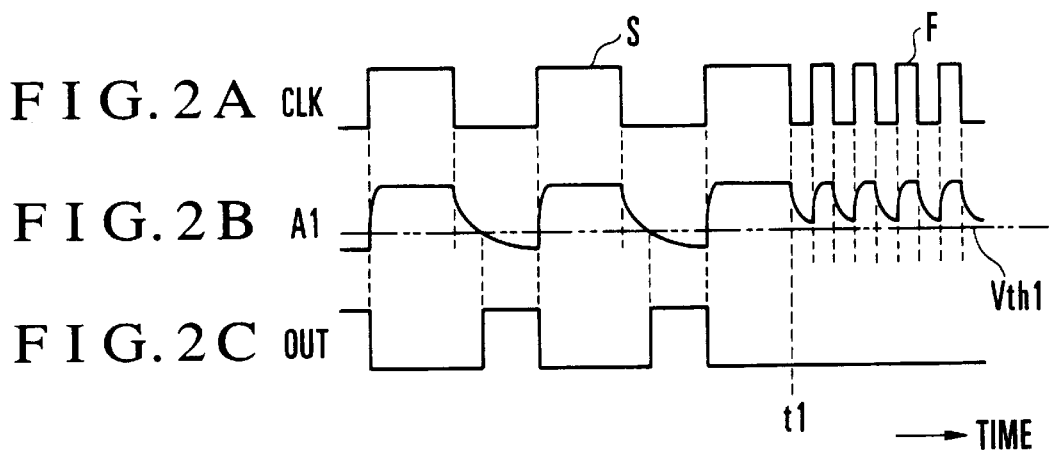
FIG. 2A CLK
FIG. 2B A1
FIG. 2C OUT
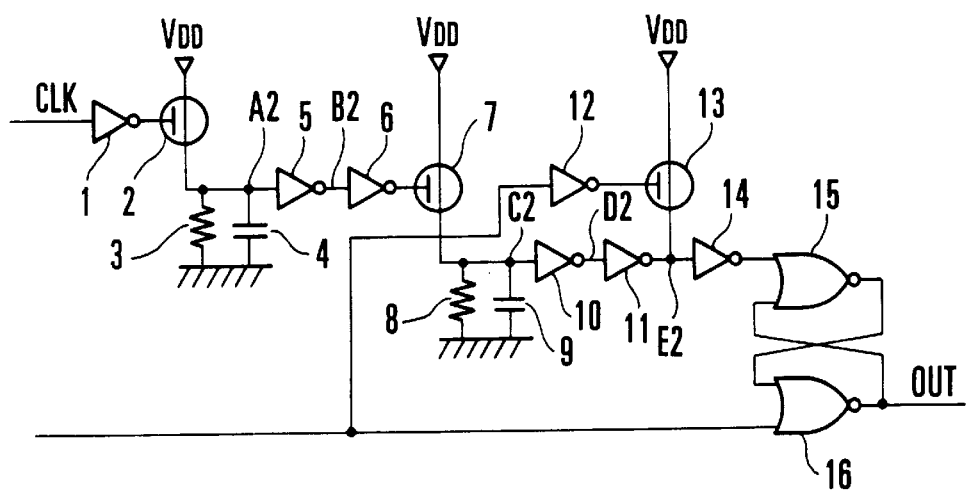
FIG. 3

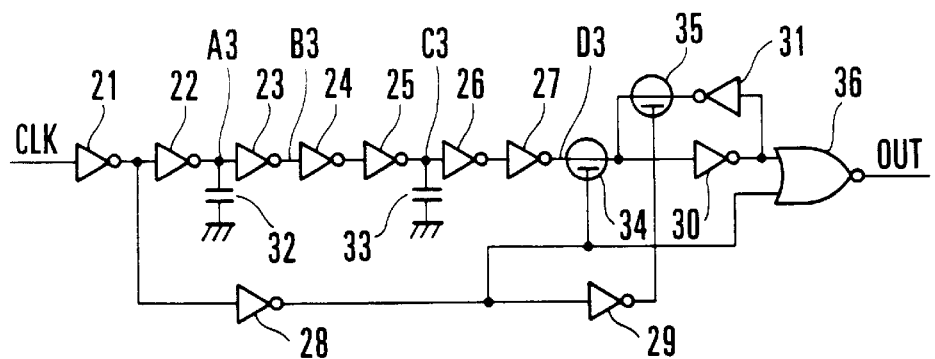
FIG. 7
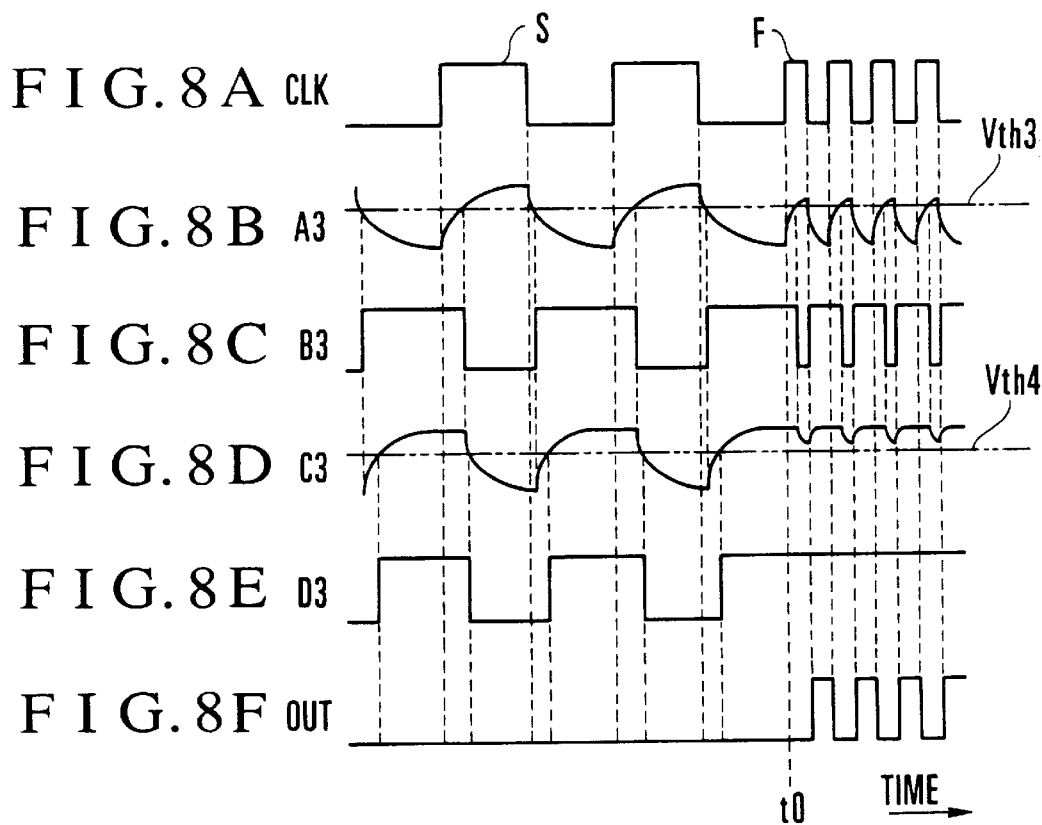
FIG. 8A CLK
FIG. 8B A3
FIG. 8C B3
FIG. 8D C3
FIG. 8E D3
FIG. 8F OUT
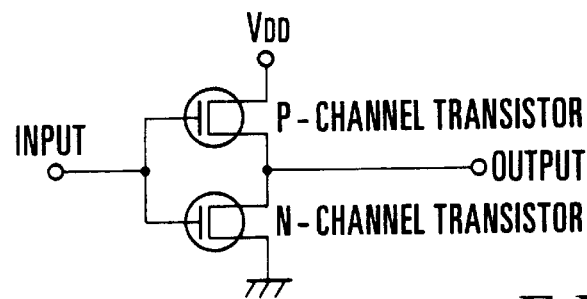
FIG. 9

6,043,749

FREQUENCY DETECTION CIRCUIT

BACKGROUND OF THE INVENTION

The present invention relates to a frequency detection circuit for detecting whether the clock frequency is within standards in a unit such as CPU or a device such as EEPROM.

It is generally known that the CPU or the EEPROM operates erroneously or suffers runaway when the clock frequency applied externally varies to a great extent. Accordingly, in order to prevent the erroneous operation and protect data of the EEPROM, a frequency detection circuit has hitherto been used which detects whether the frequency is within standards.

FIG. 7 is a circuit diagram of a conventional frequency detection circuit and FIGS. 8A–8F are time charts of voltage waveforms at essential portions of the frequency detection circuit of FIG. 7. The frequency detection circuit has inverter gates 21 to 31, capacitors 32 and 33, N-channel transistors 34 and 35 and a NOR gate 36.

A signal CLK to be measured is a clock signal as shown in FIG. 8A and when it is at "H" level, the output of the inverter gate 21 assumes "L" level, so that a P-channel MOS transistor in the inverter gate 22 of C-MOS push-pull type is turned on and the capacitor 32 is charged to power supply voltage VDD (see FIG. 9) in accordance the time determined by a time constant of an on-resistance of the P-channel transistor and a capacitance of the capacitor 32. When the measured signal CLK subsequently falls to "L", the output of the inverter 21 changes to "H" and consequently, an N-channel MOS transistor in the inverter gate 22 is turned on and the electric charge stored in the capacitor 32 is discharged in accordance with the time determined by a time constant of an on-resistance of the N-channel transistor and the capacitance of the capacitor 32. Through this operation, output A3 of the inverter gate 22 takes a waveform as shown in FIG. 8B.

Output B3 of the inverter gate 23 as shown in FIG. 8C is determined depending on whether the output A3 of the gate 22 crosses a threshold value Vth3 supplied to the inverter gate 23, though not illustrated.

Similarly, since the capacitor 33 is charged in accordance with a time constant determined by an on-resistance of a P-channel MOS transistor in the inverter gate 25 and a capacitance of the capacitor 33 and is discharged in accordance with a time constant determined by an on-resistance of an N-channel MOS transistor in the inverter gate 25 and the capacitance of the capacitor 33, output C3 of the inverter gate 25 takes a waveform as shown in FIG. 8D. Then, the level of output of the inverter gate 26 is determined depending on whether the output C3 of the gate 25 crosses a threshold value Vth4 supplied to the inverter gate 26, though not illustrated.

When the frequency of the measured signal CLK is "S" which is smaller as compared to the time constants, more strictly, when ½ of the period corresponding to the frequency "S" is larger than the time constants, the output C3 of the inverter gate 25 alternately crosses the threshold value Vth4 of the inverter gate 26. As a result, output D3 of the inverter gate 27 takes a waveform in which "H" level and "L" level appear alternately as shown in FIG. 8E. Here, the inverter gates 28 to 31, the N-channel transistors 34 and 35 and the NOR gate 36 cooperate with each other to perform such an operation that when the measured signal CLK is "H", output OUT of the NOR gate 36 assumes "L" and at the time that the measured signal CLK changes to "L" and the output D3 of the inverter gate 27 keeps its state (here, "L" level), the output OUT of the NOR gate 36 keeps "L" level as shown in FIG. 8F. Thus, when the frequency of the measured signal CLK is "S", the output OUT of the NOR gate 36 is fixed to "L" level as shown in FIG. 8F.

Subsequently, when the frequency of the measured signal CLK changes at time to "F" which is larger as compared to the time constants, more strictly, when ½ of the period corresponding to the frequency "F" is smaller than the time constants, the output C3 of the inverter gate 25 does not cross the threshold value Vth4 of the inverter gate 26 and the output D3 of the inverter gate 27 keeps "H" level. Consequently, by the action of the inverter gates 28 to 31, the transistors 34 and 35 and the NOR gate 36 in combination, the output OUT of the NOR gate 36 becomes identical to inversion of the measured signal CLK.

Thus, in the frequency detection circuit of FIG. 7, the frequency of the measured signal CLK in excess of a specified frequency is determined depending on whether the output OUT of the NOR gate changes to "H" level.

The conventional frequency detection circuit, however, faces a problem that the detection frequency varies with variations in power supply voltage. More particularly, each of the C-MOS push-pull type inverter gates 22 and 25 is constructed of a P-channel MOS transistor and an N-channel MOS transistor as shown in FIG. 9. In the frequency detection circuit, each of the capacitors 32 and 33 is charged and discharged in accordance with time constants determined by on-resistances of these P-channel and N-channel transistors and a capacitance of each of the capacitors 32 and 33, and the results of charge/discharge (FIGS. 8B and 8D) are compared with the threshold values Vth3 and Vth4 of the inverter gates 23 and 26 of the succeeding stages to detect a specified boundary frequency. But, since the on-resistance of each of the P-channel and N-channel transistors greatly varies as the power supply voltage varies, the result of charge/discharge of each of the capacitors 32 and 33 changes greatly and so the detection frequency varies.

In addition, when the terminal voltage C3 of the capacitor 33 does not cross the threshold value Vth4 of the inverter gate 26, the output OUT of the NOR gate 36 changes to "H" level and hence, the on-resistance at the time that the N-channel transistor in the inverter gate 25 is turned on during discharge of the capacitor 33 is particularly important. But, conductance gm of the N-channel transistor which determines the on-resistance has large irregularities due to manufacture, raising a problem that irregularity in the on-resistance of the N-channel transistor degrades the accuracy of detection frequency.

SUMMARY OF THE INVENTION

The present invention contemplates elimination of the above conventional problems and it is an object of the present invention to provide a frequency detection circuit which can improve the accuracy of detection frequency and can suppress a variation in detection frequency due to a variation in power supply voltage.

To accomplish the above object, according to one aspect of the invention, a frequency detection circuit comprises:

transistor switching means connected between a first electric potential and a second electric potential and having a gate applied with a clock signal to be measured;

a resistor and a capacitor connected in parallel between the output of the transistor switching means and the second electric potential, the capacitor being charged toward the first electric potential through an on-resistance of the transistor switching means when the measured clock signal assumes one level and discharged toward the second electric potential through the resistor in accordance with a time constant determined by a resistance of the resistor and a capacitance of the capacitor when the measured clock signal changes to the other level; and comparison means, connected to the output of the transistor switching means, for comparing an output voltage of the transistor switching means with a predetermined threshold voltage supplied to the comparison means and delivering a signal of alternating waveform when the frequency of the measured clock signal is smaller as compared to the time constant to cause the output voltage of the transistor switching means to cross the threshold voltage during discharge of the capacitor but a signal of constant level when the frequency of the measured clock signal is larger as compared to the time constant to cause the output voltage of the transistor switching means not to cross the threshold voltage.

With this construction, it can be detected whether the frequency of the measured clock signal exceeds a specified frequency. The frequency detection is effected by detecting whether the terminal voltage of the capacitor or the output of the switching means during discharge of the capacitor crosses or falls below the threshold voltage and hence the frequency detection is not affected by the charging time. Therefore, the detection is not affected by a variation in on-resistance of the switching means due to a variation in the power supply voltage. In addition, the resistor externally connected to the switching means can be set to have a large resistance and a desired detection frequency can be set easily.

According to another aspect of the invention, a frequency detection circuit comprises:

a first stage including first transistor switching means connected between a first electric potential and a second electric potential and having a gate applied with a clock signal to be measured, a first resistor and a second capacitor which are connected in parallel between the output of the first transistor switching means and the second electric potential, and first comparison means connected to the output of the first transistor switching means and supplied with a first threshold voltage, the first capacitor being charged toward the first electric potential through an on-resistance of the first transistor switching means when the measured clock signal assumes one level and discharged toward the second electric potential through the first resistor in accordance with a first time constant determined by a resistance of the first resistor and a capacitance of the first capacitor;

a second stage connected in series with the first stage and including second transistor switching means connected between the first electric potential and the second electric potential and having a gate connected to the output of the first comparison means, a second resistor and a second capacitor connected in parallel between the output of the second comparison means and the second electric potential, and second comparison means connected to the output of the second transistor switching means and supplied with a second threshold voltage which is different from the first threshold voltage, the second capacitor being charged toward the first electric potential through an on-resistance of the second transistor switching means when the measured clock signal assumes the other level and discharged toward the second electric potential through the second resistance in accordance with a second time constant which is different from the first time constant and determined by a resistance of the second resistor and a capacitance of the second capacitor; and a latch circuit connected to receive an output signal of the second stage, the latch circuit being cooperative with the first and second stages to deliver a signal of one level when the frequency of the measured clock signal is a prescribed frequency, a signal having the other level and indicative of an upper limit of the prescribed frequency when the frequency of the measured clock signal changes from the prescribed frequency to a first frequency which is larger as compared to the first time constant of the first stage, and a signal having the aforementioned other level and indicative of a lower limit of the prescribed frequency when the frequency of the measured clock signal changes from the prescribed frequency to a second frequency which is smaller as compared to the second time constant of the second stage.

With this construction, both of an upper limit and a lower limit of a prescribed frequency can be detected without being affected by a variation in the power supply voltage.

Preferably, components of the frequency detection circuit of the present invention and a unit or a device for which frequency detection is required are formed on a single semiconductor substrate.

With this construction, the results of the frequency detection need not be inputted externally to the unit or device to which the detection circuit is applied.

BRIEF DESCRIPTION OF THE DRAWINGS

FIG. 1 is a circuit diagram showing a frequency detection circuit according to a first embodiment of the invention.

FIGS. 2A–2C are time charts showing voltage waveforms at essential parts in the frequency detection circuit of FIG. 1.

FIG. 3 is a circuit diagram showing a frequency detection circuit according to another embodiment of the invention.

FIG. 7 is a circuit diagram showing a conventional frequency detection circuit.

FIGS. 8A–8F are time charts showing voltage waveforms at essential parts in the frequency detection circuit of FIG. 7.

FIG. 9 is a circuit diagram of an inverter gate.

DESCRIPTION OF THE PREFERRED EMBODIMENTS

Figure 4:
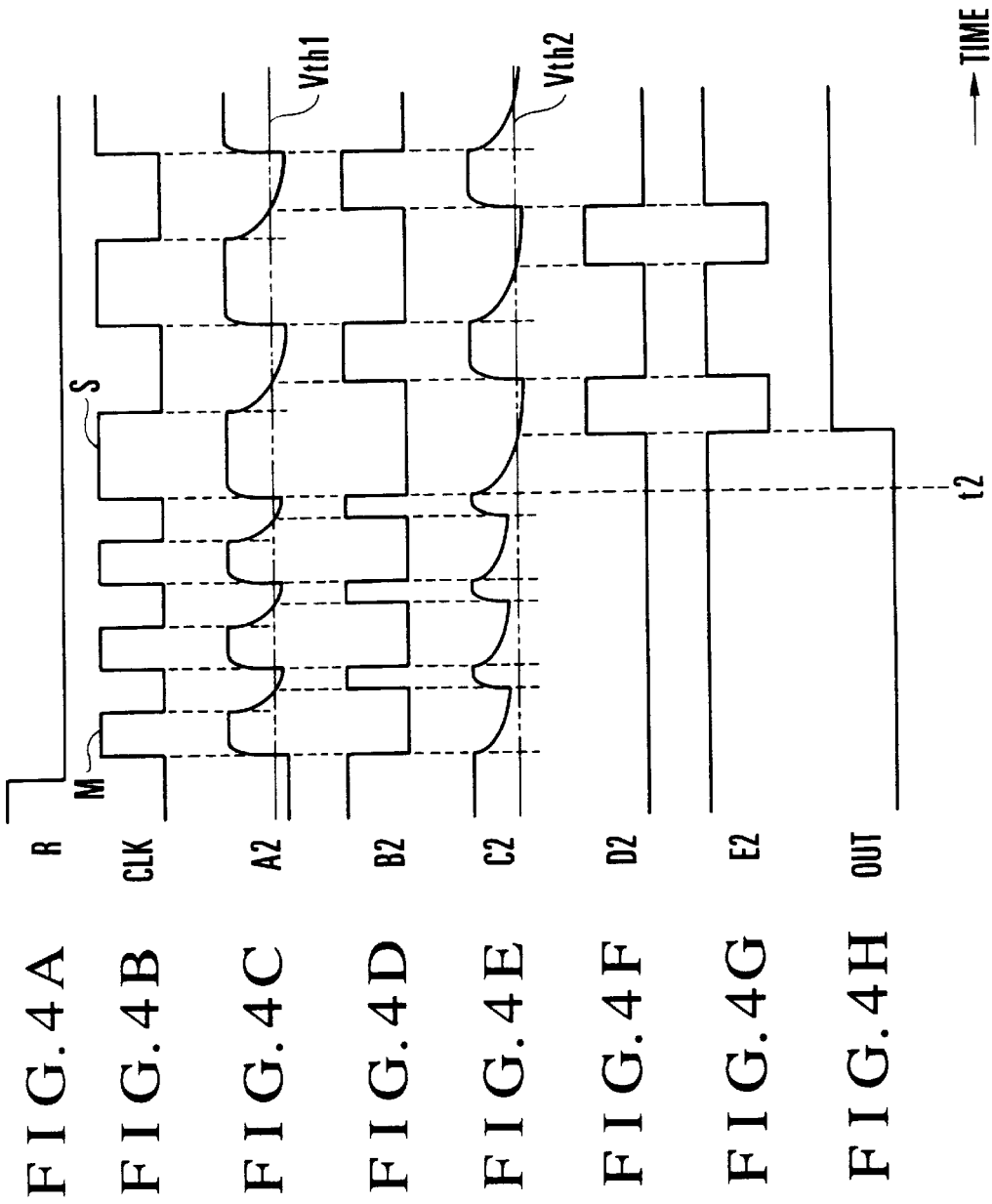
FIGS. 4A–4H are time charts showing voltage waveforms at essential parts in the frequency detection circuit of FIG. 3.
Figure 5:
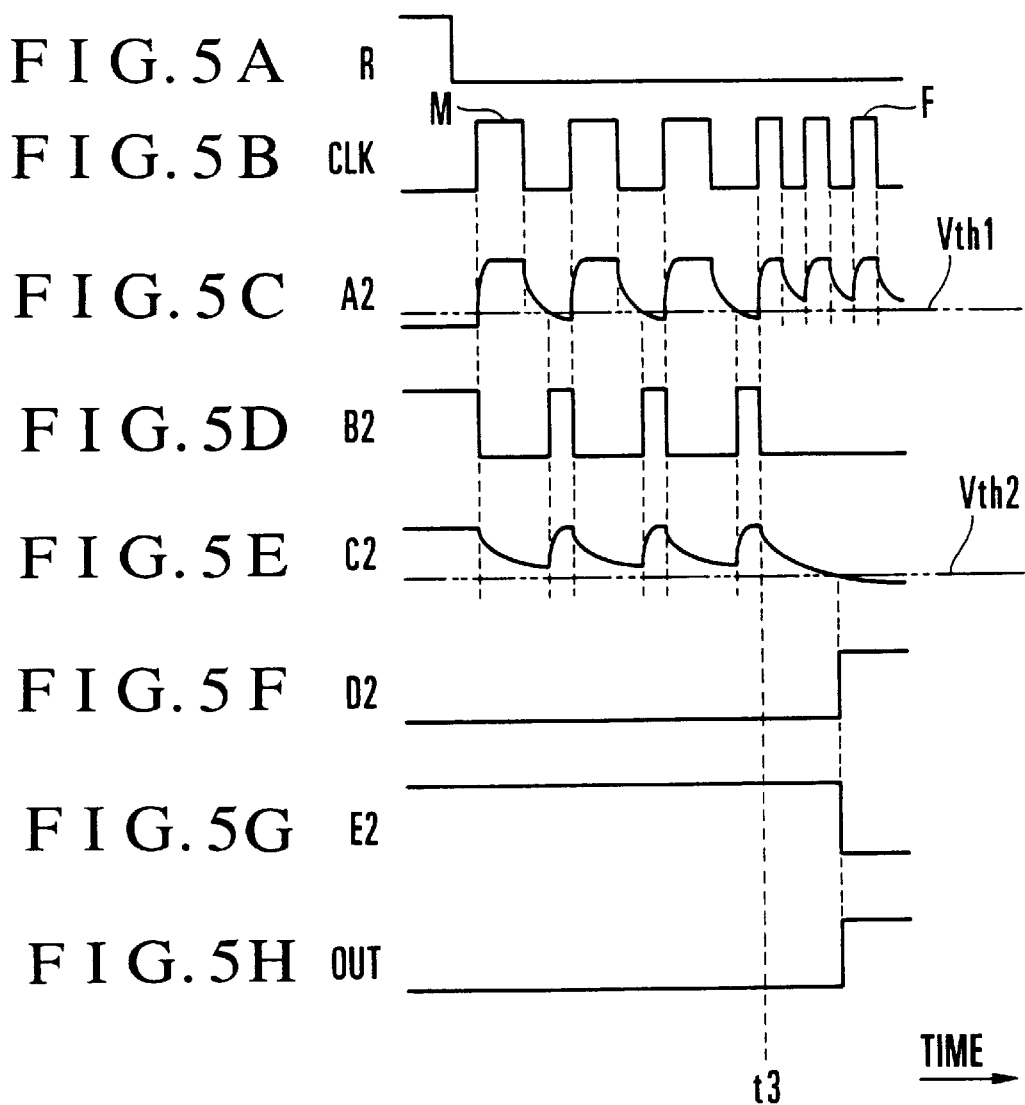
FIGS. 5A–5H are time charts showing voltage waveforms at essential parts in the frequency detection circuit of FIG. 3.

Preferred embodiments of the present invention will be described with reference to the accompanying drawings.

Referring first to FIGS. 1 and 2A–2C, a first embodiment of a frequency detection circuit of the present invention will be described. As shown in FIG. 1, the frequency detection circuit of the present embodiment comprises an inverter gate 1 applied with a signal CLK to be measured which is a clock signal, a P-channel MOS transistor 2 having a gate connected to the output of the inverter gate 1 and a source applied with a first electric potential (power supply voltage +VDD in the present embodiment) and adapted to act as transistor switching means, a resistor 3 having one end connected to a drain of the transistor 2, that is, the output of the transistor switching means and the other end applied with a second electric potential (earth potential GND in the present embodiment), a capacitor 4 having one end connected to the drain of the transistor 2 or the output of the transistor switching means and the other end applied with the second electric potential, and an inverter gate 5 connected to the drain of the transistor 2 and supplied with a threshold voltage Vth1 to be described later to act as comparison means. Accordingly, the resistor 3 and capacitor 4 are connected in parallel between the output of the transistor switching means and the second electric potential.

Firstly, operation when the frequency of measured clock signal CLK shown in FIG. 2A is "S" which is smaller as compared to a time constant determined by a resistance of resistor 3 and a capacitance of capacitor 4 will be described.

When the measured signal CLK is at "H" level, gate voltage of the transistor 2 assumes "L" level by the action of the inverter gate 1 and the P-channel MOS transistor 2 is turned on, enabling the capacitor 4 to be charged with the first electric potential (VDD) via an on-resistance of the transistor 2.

Subsequently, as the measured signal CLK changes to "L" level, the gate voltage of the transistor 2 changes to "H" level by the action of the inverter gate 1 and the transistor 2 is turned off, enabling the capacitor 4 to be discharged to the second electric potential (GND) through the resistor 3.

Terminal voltage of the capacitor 4 as above, that is, drain voltage A1 of the transistor 2 is shown in FIG. 2B.

Next, the inverter gate 5 inverts the drain voltage A1 of the transistor 2 or the output of the switching means by comparing the voltage A1 with the threshold voltage Vth1 supplied to the inverter gate 5 as indicated by dotted line in FIG. 2B and consequently, output voltage OUT of the inverter gate 5 has an alternating waveform which is shaped as shown in FIG. 2C. Needless to say, when the drain voltage A1 is higher than the threshold voltage Vth1, the output voltage OUT assumes "L" and when the drain voltage A1 is lower than the threshold voltage Vth1, the output voltage OUT assumes "H".

Next, operation when the frequency of measured clock signal CLK changes, at time t1, to "F" which is larger as compared to the time constant determined by the resistance of resistor 3 and the capacitance of capacitor 4 will be described.

When the measured signal CLK assumes "H" level, the transistor 2 is turned on to charge the capacitor 4 and when the measured signal CLK changes to "L" level, the transistor 4 is turned off to discharge the capacitor 4 in the same manner as that described above.

However, the frequency of the measured signal CLK is larger as compared to the time constant during discharge of capacitor 4 which is determined by the resistance of resistor 3 and the capacitance of capacitor 4, with the result that the capacitor 4 cannot keep discharging until the terminal voltage A1 of the capacitor 4 crosses the threshold voltage Vth1 of the gate 5 and the output OUT of the inverter gate 5 remains at "L" level.

In this manner, when the frequency of the measured signal CLK is "S", an alternating signal of "H" level and "L" level is delivered out of the inverter gate 5 and when the frequency is "F", a constant signal of "L" level is delivered out of the inverter gate 5.

Accordingly, by adjusting the time constant determined by the resistance of resistor 3 and the capacitance of capacitor 4, it can be detected whether the frequency of the measured signal CLK exceeds a specified frequency. This specified frequency is the upper limit as viewed from a frequency range of smaller frequencies than the "S" but is the lower limit as viewed from a frequency range of larger frequencies than the "F". Therefore, depending on which frequency range a frequency prescribed for such a unit as CPU lies in, the specified frequency is handled differently.

Time for charging the capacitor 4 is determined by a time constant which is set by the on-resistance of the transistor 2 and the capacitance of the capacitor 4. But in the present embodiment, the frequency detection is effected by detecting whether the terminal voltage A1 of capacitor 4 or the output of the switching means during discharge of the capacitor 4 crosses or falls below the threshold voltage Vth1 and hence the frequency detection is not affected by the charging time. Therefore, the detection frequency is not affected by a variation in on-resistance of the transistor 2 due to a variation in the power supply voltage VDD.

In addition, the on-resistance of the transistor is determined by conductance gm and therefore, it is difficult to make the on-resistance large and the detection frequency cannot be freely set in the FIG. 7 frequency detection circuit. Contrary to this, in the frequency detection circuit of the present embodiment, the resistor 3 can be set to have a large resistance and a desired detection frequency can be set with ease.

Referring to FIG. 3, there is illustrated another embodiment of the frequency detection circuit according to the present invention. Voltage waveforms at essential parts in the FIG. 3 frequency detection circuit are depicted in time charts of FIGS. 4A–4H and 5.

The frequency detection circuit of FIG. 1 can afford to detect only one frequency boundary value, with the result that the frequency of the measured signal CLK can be detected either as lower than the lower limit or as to is higher than the upper limit.

The present embodiment intends to permit detection of both of upper and lower limits of a frequency within standards, that is, a frequency prescribed for a unit, for example, a CPU. To this end, in the present embodiment, a first stage includes, like the first embodiment, a first P-channel MOS transistor 2, a first resistor 3, a first capacitor 4 and an inverter gate 5 serving as first comparison means is connected in series with a second stage including a second P-channel MOS transistor 7, a second resistor 8, a second capacitor 9 and an inverter gate 10 serving as second comparison means, and time constants of the two stages are set to different values. The first and second transistors 2 and 7 serve as first and second transistor switching means, respectively.

Operation when the frequency of measured clock signal CLK is changed, at time t2, from a frequency "M" within standards to a frequency "S" which is smaller as compared to a time constant determined by a resistance of the second resistor 8 and a capacitance of the second capacitor 9 will be described with reference to FIGS. 4A–4H. In the present embodiment, inverter gates 11, 12 and 14, a P-channel MOS transistor 13 and NOR gates 15 and 16 constitute a latch circuit and the operation of the latch circuit will first be described.

Output OUT of the NOR gate 16 is at "L" level as shown in FIG. 4H when a reset signal R shown in FIG. 4A is at "H"

level. On the other hand, with the reset signal R kept at "H" level, gate voltage of the transistor 13 assumes "L" by the action of the inverter gate 12, so that the transistor 13 is turned on and the input of the inverter gate 14 is fixed to "H" level.

As a result, one input of the NOR gate 15 assumes "L" while the other input connected to the output of the NOR gate 16 assuming "L". On the other hand, one input of the NOR gate 16 connected to the reset signal is at "H" and the other input connected to the output of the NOR gate 15 assumes "H". Accordingly, the output OUT of the NOR gate 16 is fixed to "L" level regardless of the measured signal CLK. In other words, detection of the frequency of measured signal CLK is not allowed until the reset signal R assumes "L".

When the measured signal CLK of frequency "M" assumes "H" level after the reset signal R has changed to "L" to permit the frequency detection as shown in FIG. 4B, the transistor 2 is turned on to charge the capacitor 4 to the first electric potential (VDD) and as the measured signal CLK changes to "L" level, the transistor 2 is turned off to discharge the capacitor 4 to the second electric potential (GND). As a result, terminal voltage A2 of the capacitor 4 has a waveform as shown in FIG. 4C.

The inverter gate 5 inverts drain voltage A2 of the transistor 2, that is, the output of the first transistor switching means, by comparing the voltage A2 with a first threshold voltage Vth1 supplied to the inverter gate 5 and as indicated by dotted line as shown in FIG. 4C and delivers output voltage B2 which is shaped as shown in FIG. 4D.

Next, the P-channel MOS transistor 7 having its gate connected to the output of the inverter gate 5 of the first stage through the inverter gate 6 behaves similarly to the transistor 2 so as to be turned on when the output voltage B2 of the inverter gate 5 assumes "H" level to apply "L" level to the gate of the transistor 7 through the inverter gate 6 and so as to be turned off when the voltage B2 assumes "L" level.

Thus, with the transistor 7 turned on, the capacitor 9 is charged to the first electric potential (VDD) and with the transistor 7 turned off, the capacitor 9 is discharged to the second electric potential (GND), so that terminal voltage C2 of the capacitor 9 has a waveform as shown in FIG. 4E.

The inverter gate 10 inverts drain voltage C2 of the transistor 7, that is, the output of the second transistor switching means, by comparing the voltage C2 with a second threshold voltage Vth2 supplied to the inverter gate 10 and indicated by dotted line as shown in FIG. 4E and consequently, output voltage D2 of the inverter gate 10 has a waveform which is shaped as shown in FIG. 4F.

In the above operation, the frequency of measured clock signal CLK is "M" which is larger as compared to the time constant during discharge of capacitor 9 which is determined by the resistance of resistor 8 and the capacitance of capacitor 9, so that the capacitor 9 is not discharged to such an extent that the terminal voltage C2 of the capacitor 9 crosses the threshold voltage Vth2 of the gate 10 and output D2 of the inverter gate 10 remains at "L" level.

Consequently, output E2 of the inverter gate 11 assumes "H" level as shown in FIG. 4G to take the same state as that established when the reset signal R is "H", causing the output OUT of the NOR gate 16 to keep "L" level.

Subsequently, when the frequency of the measured signal CLK changes to a frequency "S" which is smaller as compared to the time constant during discharge of the capacitor 9 determined by the resistance of resistor 8 and the capacitance of capacitor 9, the terminal voltage C2 of the capacitor 9 falls below the threshold voltage Vth2 of the gate 10 as shown in FIG. 4E. This causes the output D2 of the inverter gate 10 to change to "H" level as shown in FIG. 4F.

As a result, the output E2 of the inverter gate 11 changes to "L" level and the output OUT of the NOR gate 16 changes to "H" level. The output OUT which has once changed to "H" level keeps its "H" level until the reset signal R of "H" level is applied to NOR gate 16. In this manner, the frequency falling below a lower limit of the frequency of the measured signal CLK can be detected.

Referring now to FIGS. 5A–5H, operation when the frequency of the measured signal CLK changes, at time t3, from "M" to "F" which is larger as compared to the time constant determined by the resistance of resistor 3 and the capacitance of capacitor 4 will be described.

It is now assumed that after the reset signal R is rendered to be "L" to permit the frequency detection, the frequency of a measured signal CLK changes from "M" to "F", the capacitor 4 is not discharged to such an extent that the terminal voltage A2 of the capacitor 4, that is, the output of the first transistor switching means crosses the threshold voltage Vth1 of the inverter gate 5 as shown in FIG. 5C and consequently the output B2 of the inverter gate 5 keeps "L" level as shown in FIG. 5D.

Thus, the frequency of the output B2 fixed to "L" level becomes smaller as compared to the time constant during discharge of capacitor 9 determined by the resistance of resistor 8 and the capacitance of capacitor 9 and as a result, the terminal voltage C2 of the capacitor 9, that is, the output of the second transistor switching means falls below the threshold voltage Vth2 of the gate 10. This causes the output D2 of the inverter gate 10 to change to "H" level as shown in FIG. 5F.

As a result, the output E2 of the inverter gate 11 changes to "L" level and the output OUT of the NOR gate 16 changes to "H" level. In this manner, the frequency of the measured signal CLK exceeding an upper limit can be detected.

For simplification of explanation, the frequency "M" has been described as having one value but it can take values within the range of standards.

As will be seen from the above, by adjusting the time constant determined by the resistance of resistor 3 and the capacitance of capacitor 4 such that this time constant is larger as compared to the frequency "F" of measured signal CLK and that this time constant is smaller as compared to the frequency "S" of measured signal CLK and by adjusting the time constant determined by the resistance of resistor 8 and the capacitance of capacitor 9 such that this time constant is smaller as compared to the frequency "S" of measured signal CLK and that this time constant is larger as compared to the frequency "M" of measured signal CLK, it can be detected with high accuracy whether the frequency of the measured signal CLK increases beyond the predetermined upper limit or decreases beyond the predetermined lower limit, without being affected by a variation in the power supply voltage.

In the present embodiment, the output of the inverter gate 5 is connected to the gate of the transistor 7 through the inverter gate 6 but it may be connected directly. In that case, the phase of the terminal voltage C2 of the capacitor 9 as shown in FIG. 4E and in FIG. 5E changes to shorten the discharge time and so the time constant is required to be adjusted by changing the resistance of resistor 8 and the capacitance of capacitor 9.

Figure 10A:
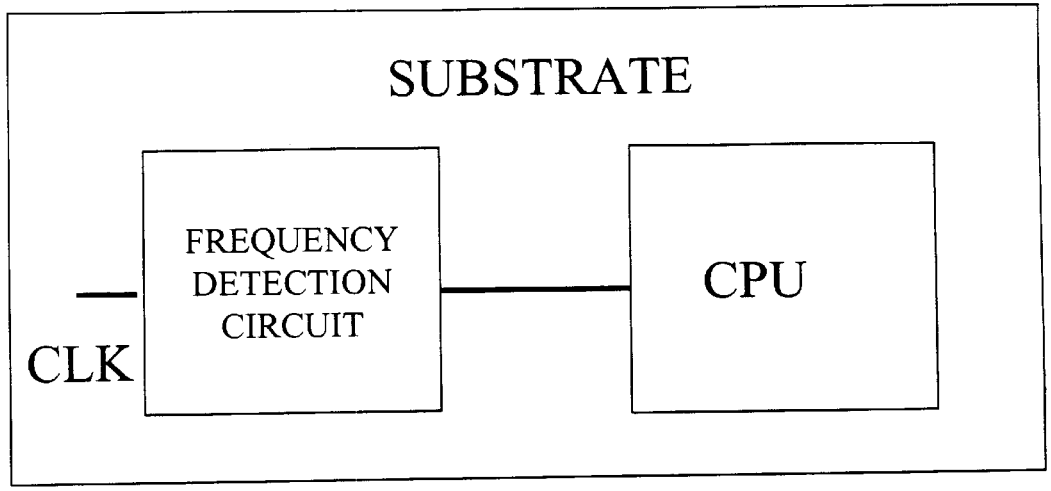
FIGS. 10A–B are circuit diagrams of exemplary embodiments according to the invention.
Figure 10B:
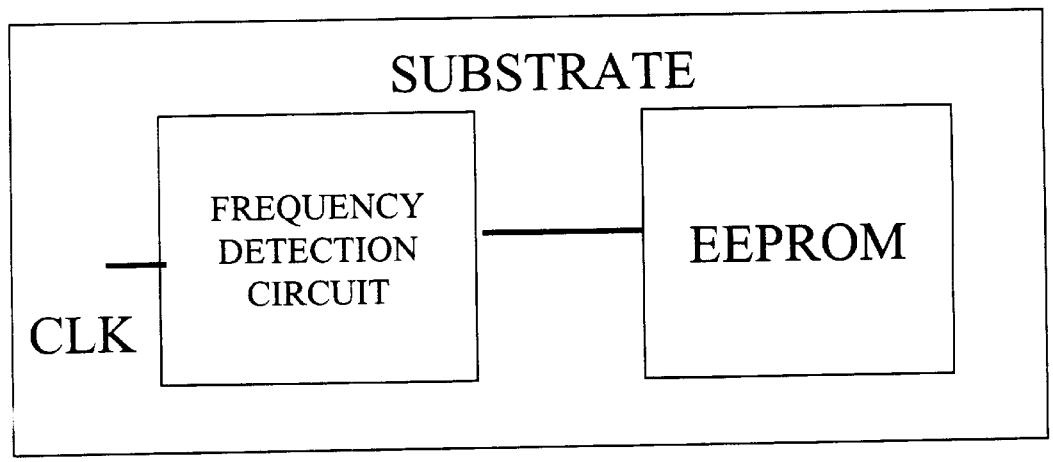

Preferably, the frequency detection circuit of FIG. 1 and a unit such as CPU or a device such as EEPROM to which the detection circuit is applied are formed on the same semiconductor substrate as shown in FIGS. 10A and 10B respectively. When components such as the transistors, resistors, capacitors and comparison means of the frequency detection circuit and the unit such as CPU or the device such as EEPROM for which the frequency detection is required are formed on the same semiconductor substrate, the results of the frequency detection need not be inputted externally to the unit or device, thereby bringing about advantages that the number of terminals can be decreased and the external influence which interferes with the detection results when the detection results are inputted externally can be eliminated. Further, the influence of various loads which occur during packaging, including load capacitances of terminals, can be eliminated.

Figure 6:
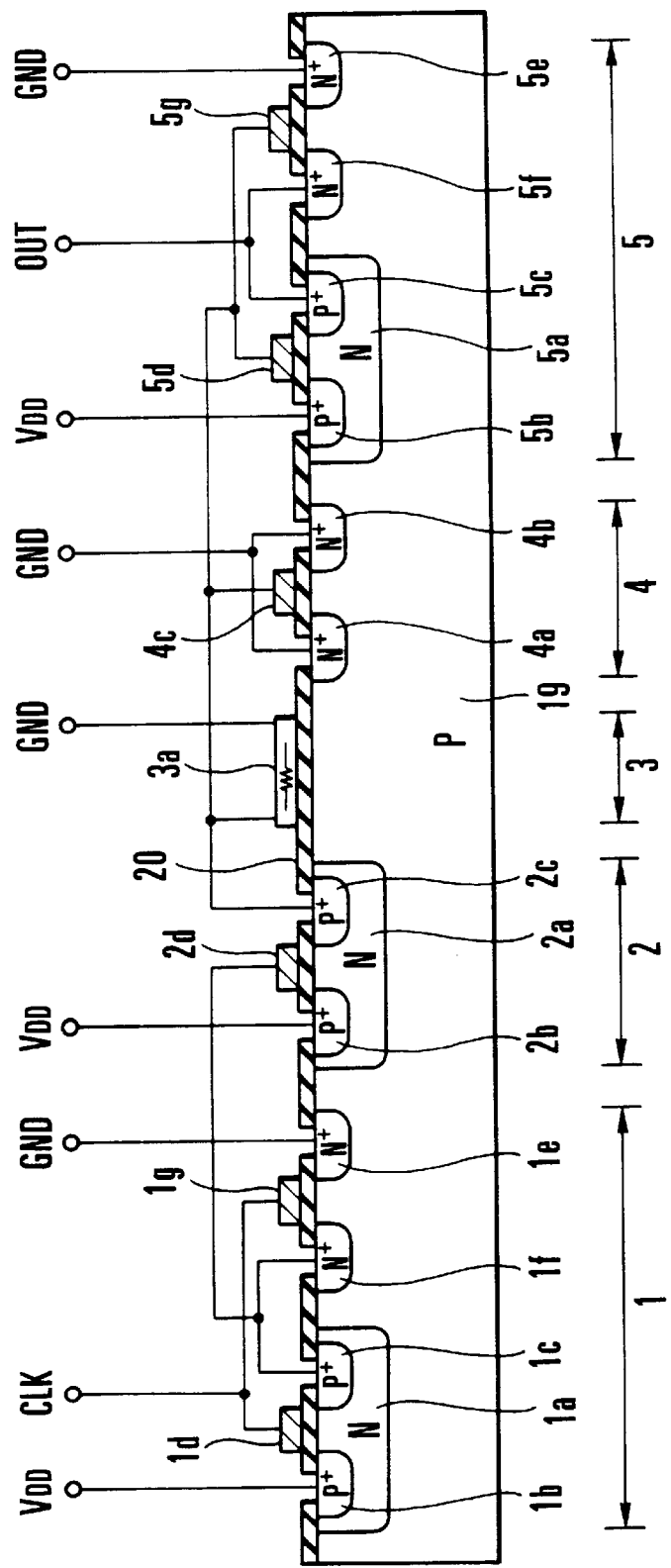
FIG. 6 is a sectional view of the FIG. 1 frequency detection circuit when a unit such as CPU to which the circuit is applied and circuit elements are formed on a single semiconductor substrate.

Only the FIG. 1 frequency detection circuit to be formed on a single semiconductor substrate, together with the CPU or EEPROM, is illustrated in sectional form in FIG. 6 and the CPU or EEPROM are not depicted in the figure.

The inverter gate 1, transistor 2, resistor 3, capacitor 4 and inverter gate 5 are formed on a substrate 19 made of P-type single crystal Si.

The inverter gate 1 includes a P-channel MOS transistor and an N-channel MOS transistor. The P-channel MOS transistor has an N well 1a, a source region 1b of P+ Si, a drain region 1c of P+ Si, an oxide film 20 serving as a gate insulating film and a gate electrode 1d made of polycrystal Si. The N-channel MOS transistor has a source region 1e made of N+ Si, a drain region 1f made of N+ Si an oxide film 20 serving as a gate insulating film and a gate electrode 1g made of polycrystal Si.

The P-channel MOS transistor 2 has an N well 2a, a source region 2b of P+ Si, a drain region 2c of P+ Si, an oxide film 20 serving as a gate insulating film, and a gate electrode 2d of polycrystal Si. The resistor 3 is formed of a polycrystal Si layer 3a formed on the oxide film 20.

The capacitor 4 has a MOS transistor structure, having a source 4a of N+ Si, a drain region 4b of N+ Si, an oxide film 20 serving as a gate insulating film and a gate electrode 4c of polycrystal Si.

The inverter gate 5 includes a P-channel MOS transistor and an N-channel MOS transistor. The P-channel MOS transistor has an N well 5a, a source region 5b of P+ Si, a drain region 5c of P+ Si, an oxide film 20 serving as a gate insulating film and a gate electrode 5d of polycrystal Si. The N-channel MOS transistor has a source region 5e of N+ Si, a drain region 5f of N+ Si, an oxide film 20 serving as a gate insulating film and a gate electrode 5g of polycrystal Si.

In FIG. 6, the drain and source electrodes are not illustrated. Obviously, components of the frequency detection circuit of FIG. 3 can be formed similarly, together with the CPU or EEPROM, on a single semiconductor substrate.

In the foregoing embodiments, the P-channel transistors are used but they may be replaced with N-channel transistors. In that case, the resistors 3 and 8 and the capacitors 4 and 9 may be connected to the power supply voltage VDD and the sources of the transistors 2 and 7 may be grounded in order to detect whether the terminal voltage during discharge exceeds the threshold voltage.

In the foregoing embodiments, the inverter gates are used as comparison means but they may be replaced with comparators.

What is claimed is:

1. A frequency detection circuit comprising:
a transistor switch, connected between a first electric potential and a second electric potential, having a gate applied with a clock signal to be measured;
a resistor and a capacitor, which both are connected in parallel between the output of said transistor switch and said second electric potential, said capacitor being charged toward said first electric potential through an on-resistance of said transistor switch when the measured clock signal assumes one level and discharged toward said second electric potential through said resistor in accordance with a time constant determined by a resistance of said resistor and a capacitance of said capacitor when the measured clock signal changes to the other level; and
a comparator, connected to the output of said transistor switch, for comparing an output voltage of said transistor switch with a predetermined threshold voltage supplied to said comparator and delivering a signal of alternating waveform when the frequency of the measured clock signal is smaller as compared to said time constant and the output voltage of said transistor switch crosses said threshold voltage during discharge of said capacitor, and said comparator delivering a signal of constant level when the frequency of the measured clock signal is larger as compared to said time constant and the output of said transistor switch does not cross said threshold voltage.

2. A frequency detection circuit comprising:
a first stage including a first transistor switch, connected between a first electric potential and a second electric potential, having a gate applied with a clock signal to be measured, a first resistor and a first capacitor, which are both connected in parallel between the output of said first transistor switch and said second electric potential, and a first comparator connected to the output of said first transistor switch and supplied with a first threshold voltage, said first capacitor being charged toward said first electric potential through an on-resistance of said first transistor switch when the measured clock signal assumes one level and discharged toward said second electric potential through said first resistor in accordance with a first time constant determined by a resistance of said first resistor and a capacitance of said first capacitor;
a second stage connected in series with said first stage and including a second transistor switch, connected between said first electric potential and said second electric potential, having a gate connected to the output of said first comparator, a second resistor and a second capacitor connected in parallel between the output of said second transistor switch and said second electric potential, and a second comparator connected to the output of said second transistor switch and supplied with a second threshold voltage which is different from said first threshold voltage, said second capacitor being charged toward said first electric potential through an on-resistance of said second transistor switch when the measured clock signal assumes the other level and discharged toward said second electric potential through said second resistor in accordance with a second time constant which is different from said first time constant and determined by a resistance of said second resistor and a capacitance of said second capacitor; and
a latch circuit connected to receive an output signal of said second stage, said latch circuit being cooperative with said first and second stages to deliver a signal of one level when the frequency of the measured clock signal is a prescribed frequency, a signal having the other level and indicative of an upper limit of said prescribed frequency when the frequency of the measured clock signal changes from the prescribed frequency to a first frequency which is larger as compared to said first time constant of said first stage, and a signal having the aforementioned other level and indicative of a lower limit of said prescribed frequency when the frequency of the measured clock signal changes from said prescribed frequency to a second frequency which is smaller as compared to said second time constant of said second stage.

3. A frequency detection circuit according to claim 1, wherein said frequency detection circuit is applied to one of a central processing unit (CPU) or an electrically erasable programmable read-only memory (EEPROM) to detect a frequency for use in said CPU or said EEPROM, and components of said frequency detection circuit and said CPU or said EEPROM are formed on a single semiconductor substrate.

4. A frequency detection circuit according to claim 2, wherein said frequency detection circuit is applied to one of a central processing unit (CPU) or an electrically erasable programmable read-only memory (EEPROM) to detect a frequency for use in said CPU or said EEPROM, and components of said frequency detection circuit and said CPU or said EEPROM are formed on a single semiconductor substrate.

* * * * *